United States Patent [19]
Akaogi

[11] Patent Number: 5,280,451
[45] Date of Patent: Jan. 18, 1994

[54] SIGNATURE CIRCUIT FOR NON-VOLATILE MEMORY DEVICE

[75] Inventor: Takao Akaogi, Inagi, Japan

[73] Assignee: Fujitsu Limited, Kawasaki, Japan

[21] Appl. No.: 656,501

[22] Filed: Feb. 19, 1991

[30] Foreign Application Priority Data

Feb. 19, 1990 [JP] Japan .................................. 2-37582

[51] Int. Cl.⁵ .............................................. G11C 29/00
[52] U.S. Cl. .............................. 365/200; 365/189.01; 365/189.05; 365/230.01; 365/185; 365/230.03
[58] Field of Search .................... 365/182, 185, 189.01, 365/189.05, 230.01, 200, 230.03

[56] References Cited

U.S. PATENT DOCUMENTS

| | | | |
|---|---|---|---|
| 4,055,802 | 10/1977 | Panousis et al. | 324/73 AT |
| 4,597,063 | 6/1986 | Takemae | 365/189.01 |
| 4,599,709 | 7/1986 | Clemons | 365/200 |
| 4,809,227 | 2/1989 | Suzuki et al. | 365/189.01 |
| 4,887,242 | 12/1989 | Hashimoto | 365/189.05 |
| 4,998,223 | 3/1991 | Akaogi | 365/200 |
| 5,023,839 | 6/1991 | Suzuki et al. | 365/200 |

FOREIGN PATENT DOCUMENTS

| | | | |
|---|---|---|---|
| 0116464 | 8/1984 | European Pat. Off. | 365/200 |
| 61-276200 | 12/1986 | Japan | 365/230.1 |
| 2-143457 | 6/1990 | Japan | 365/189.01 |
| 3-100998 | 4/1991 | Japan | 365/230.1 |

Primary Examiner—Rolf Hille
Assistant Examiner—Minhloan Tran
Attorney, Agent, or Firm—Staas & Halsey

[57] ABSTRACT

A signature circuit stores signature information indicative of one of a plurality of device functions of a non-volatile memory device which includes first memory cells which are respectively coupled to one of a plurality of word lines and to one of a plurality of bit lines. The signature circuit includes second memory cells which are respectively connected to the bit lines which are grouped into a plurality of blocks, at least one predetermined word line which is provided exclusively for the second memory cells and is connected to each of the memory cells, and a selecting circuit coupled to the bit lines for selecting one of the blocks. The second memory cells in each of the blocks store one kind of signature information, so that a number of blocks is equal to a number of kinds of signature information that can be stored in the signature circuit.

10 Claims, 4 Drawing Sheets

SIGNATURE CIRCUIT FOR NON-VOLATILE MEMORY DEVICE

BACKGROUND OF THE INVENTION

The present invention generally relates to signature circuits, and more particularly to a signature circuit which stores device functions of a non-volatile memory device.

In non-volatile memory devices such as a programmable read only memory (PROM), the device function, such as the write function, differs depending on the chip although the same basic chip (PROM) is used. Hence, in order to clearly indicate the device function of the chip to the user, the PROM is provided with a signature circuit which prestores signature information which describes the device function.

Conventionally, the following measures are taken in order to afford a plurality of different kinds of device functions with a single basic chip. For example, one bonding wire interconnection is made with respect to the basic chip for providing a first device function, and another bonding wire interconnection is made with respect to the same basic chip for providing a second, different device function. As a result, it becomes possible to produce chips having selectable, different device functions while using the same basic chip. The selectable device functions of each chip are stored in the signature circuit in the form of plural signature type information.

FIG. 1 generally shows a PROM which is provided with an example of a conventional signature circuit. In FIG. 1, the PROM includes a memory cell array 1, a row decoder 2, a column decoder 3 and a sense amplifier 4.

FIG. 2 shows the conventional signature circuit together with related parts of the PROM shown in FIG. 1. One of bit lines b0 through bn is selected by a corresponding one of bit line selection signals Y0 through Yn respectively applied to n-channel field effect transistors (FETs) Q0 through Qn in response to an address signal, and the thus-selected bit line thereby is connected to a sense amplifier 4. Likewise, one of word lines W0 through Wn+2 is selected by a corresponding one of the respective word line selection signals X0 through Xn+2 in response to the address signal. Only one word line is shown in FIG. 1 in association with the one row of memory cells MS0 through MSn, for purposes of clarity, and it will be understood to represent a plurality of word lines W0 through Wn which are respectively connected to the memory cells MS0 through MS, which store the actual information, for plural such rows of memory cells. A memory cell which is written with a value "1" permits a current flow therethrough when the word line connected thereto is selected, while a memory cell which is not written with information (or written with a value "0") does not permit a current flow therethrough when the word line connected thereto is selected.

A plurality of ROM cells for storing first type signature information are connected to the word line Wn+1, and a plurality of ROM cells for storing second type signature information are connected to the word line Wn+2. In this example, a short-circuit indicated by a mark "x" is formed between a drain of the ROM cell and the corresponding bit line to store the value "1", and an open circuit indicated by a mark "o" is formed between the drain of the ROM cell and the corresponding bit line to store the value "0". The values "0" and "1" are written selectively into the ROM cells which are connected to the word lines Wn+1 and Wn+2 to store the first and second signature information. The writing of information of the type written into the memory cells MS, which are connected to the word lines W0 through Wn is not carried out with respect to the ROM cells which are provided for storing the first and second signature information.

According to the conventional signature circuit, the first signature information is read out by setting the word line selection signals X0 through Xn and Xn+2 to low levels and the word line selection signal Xn+1 to a high level, and successively selecting the bit lines b0 through bn. Similarly, the second signature information is read out by setting the word line selection signals X0 through Xn and Xn+1 to low levels and the word line selection signal Xn+2 to a high level, and successively selecting the bit lines b0 through bn.

Therefore, the conventional signature circuit requires a number of word lines exclusively for the signature circuit, where this number is equal to the number of signature information types to be stored. In the example shown in FIG. 1, two word lines Xn+1 and Xn+2 are provided exclusively for the signature circuit because first and second signature information types are to be stored. Accordingly, the number of word lines provided exclusively for the signature circuit increases with the number of signature information types to be stored, and there is a problem in that a large area is occupied by the word lines and related interconnections.

SUMMARY OF THE INVENTION

Accordingly, it is a general object of the present invention to provide a novel and useful signature circuit in which the problem described above is eliminated.

Another and more specific object of the present invention is to provide a signature circuit for storing plural signature type information indicative of a plurality of respective, different and selectable device functions of a non-volatile memory device which includes an array of plural rows and plural columns of first memory cells the rows thereof respectively coupled to a plurality of word lines and the columns thereof respectively coupled to a plurality of bit lines and, further, at least one row of plural second memory cells which are respectively connected to the plurality bit lines and which are grouped into a plurality of blocks, and a corresponding, at least one predetermined word line which is provided exclusively for the second memory cells and is connected to each of the second memory cells of the corresponding row, and selecting means coupled to the bit lines for selecting one of the blocks of bit lines where the respective second memory cells of each block store one kind of signature information, so that a number of the plurality of block defines the number of the different types, or kinds, of signature information that can be stored in the signature circuit. According to the signature circuit of the present invention, the number of word lines required exclusively for storing the signature information can can be minimized, and the area occupied by the signature circuit can be minimized.

Other objects and further features of the present invention will be apparent from the following detailed description when read in conjunction with the accompanying drawings.

DESCRIPTION OF THE PREFERRED EMBODIMENTS

Figure 1:
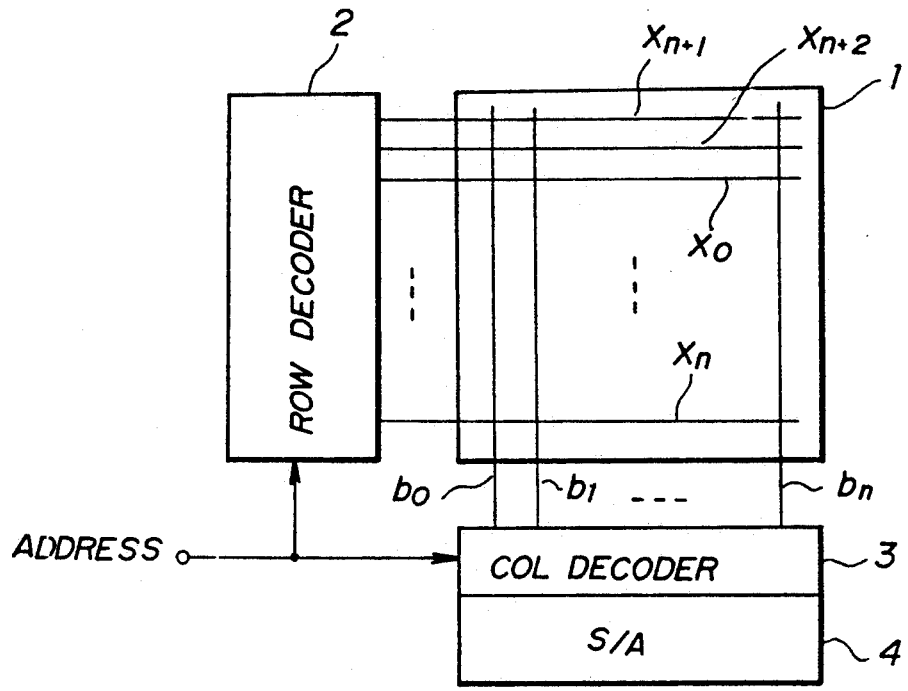
FIG. 1 is a system block diagram showing a general construction of a PROM provided with an example of a conventional signature circuit.
Figure 2:
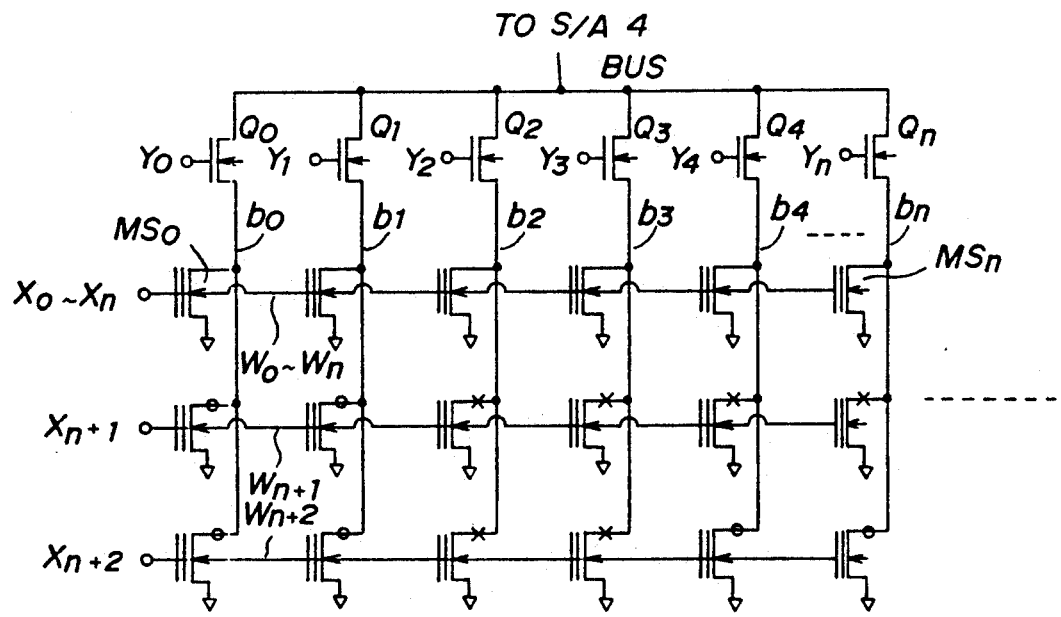
FIG. 2 is a circuit diagram showing an essential part of the PROM shown in FIG. 1.
Figure 3:
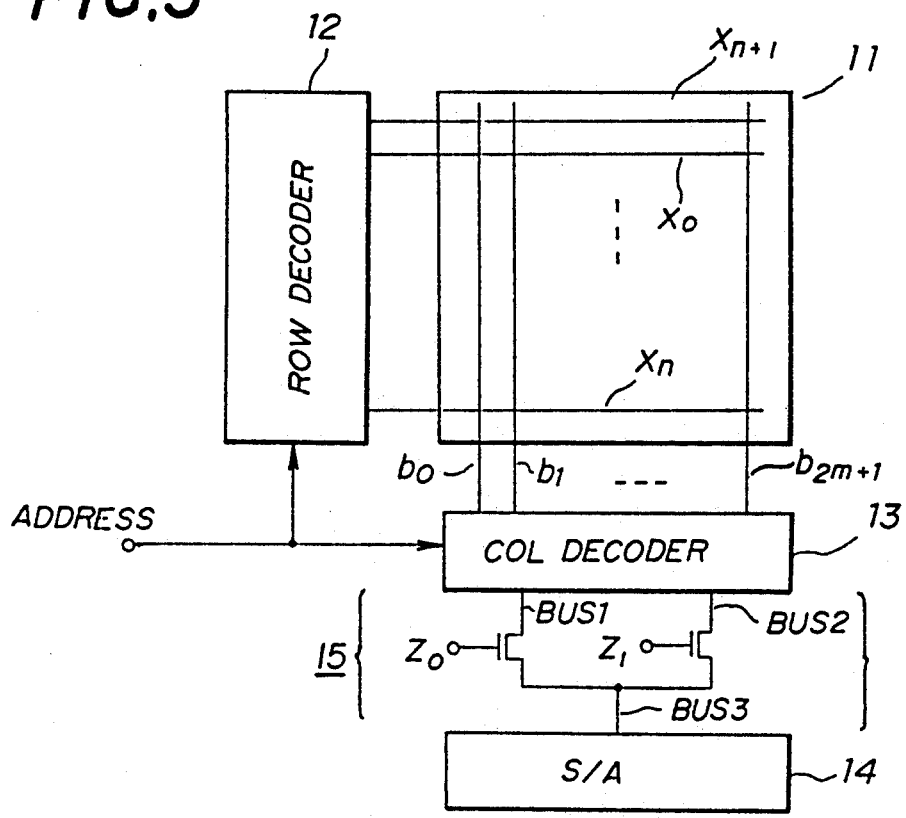
FIG. 3 is a system block diagram showing a general construction of a PROM to which a first embodiment of a signature circuit according to the present invention is applied.

FIG. 3 generally shows a PROM to which a first embodiment of a signature circuit according to the present invention may be applied. The PROM shown in FIG. 3 includes a memory cell array 11, a row decoder 12, a column decoder 13, a sense amplifier 14 and a bus line selection circuit 15.

Figure 4:
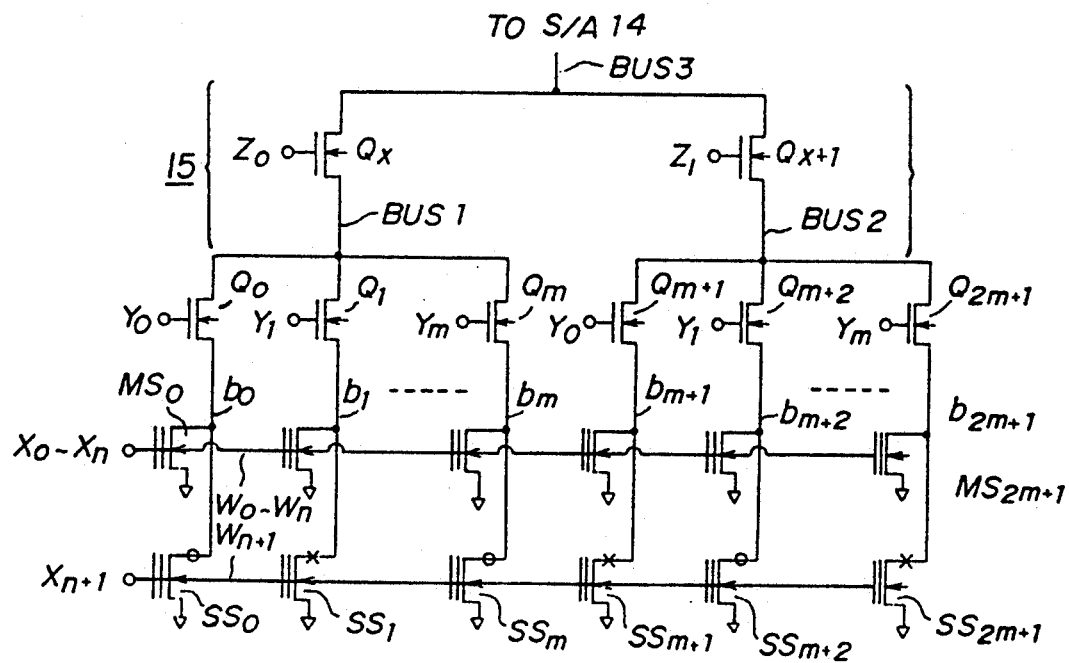
FIG. 4 is a circuit diagram showing the first embodiment of the signature circuit according to the present invention.

FIG. 4 shows an essential part of the first embodiment together with related parts of the PROM shown in FIG. 3. In this embodiment, it is assumed for the same of convenience that two kinds of signature information are to be stored. For this reason, bit lines $b_0$ through $b_{2m+1}$ are divided into two blocks.

The bit lines $b_0$ through $b_m$ are connected to a bus line BUS1 via respective FETs $Q_0$ through $Q_m$ which receive corresponding bit line selection signals $Y_0$ through $Y_m$. The bit lines $b_{m+1}$ through $b_{2m+1}$ are connected to a bus line BUS2 via respective FETs $Q_{m+1}$ through $Q_{2m+1}$ which also receive the corresponding bit line selection signals $Y_0$ through $Y_m$. The bus lines BUS1 and BUS2 are connected to the sense amplifier 14 via respective n-channel FETs $Q_x$ and $Q_{x+1}$ and a bus line BUS3. The FETs $Q_x$ and $Q_{x+1}$ respectively receive bus line selection signals $Z_0$ and $Z_1$.

Memory cells $MS_0$ through $MS_{2m+1}$ for storing information are connected to word lines $W_0$ through $W_n$ which respectively receive word line selection signals $X_0$ through $X_n$. ROM cells $SS_0$ through $SS_{2m+1}$ for storing first and second kinds of signature information are connected to a word line $W_{n+1}$ which receives a word line selection signal $X_{n+1}$. The first signature information is stored in the ROM cells $SS_0$ through $SS_m$ which correspond to the bit lines $b_0$ through $b_m$, and the second signature information is stored in the ROM cells $SS_{m+1}$ through $SS_{2m+1}$ which correspond to the bit lines $b_{m+1}$ through $b_{2m+1}$.

When reading the first signature information, only the word line selection signal $X_{n+1}$ out of the word line selection signals $X_0$ through $X_{n+1}$ is set to a high level in response to an address signal, and the other word line selection signals are set to low levels. In addition, only the bus line selection signal $Z_0$ is set to a high level in response to the address signal, and the other bus line selection signal $Z_1$ is set to a low level. As a result, the FET $Q_x$ is turned ON, and the first signature information is read out from the ROM cells $SS_0$ through $SS_m$ by successively selecting the bit lines $b_0$ through $b_m$ by the bit line selection signals $Y_0$ through $Y_m$.

Similarly, when reading the second signature information, only the word line selection signal $X_{n+1}$ out of the word line selection signals $X_0$ through $X_{n+1}$ is set to the high level in response to the address signal, and the other word line selection signals are set to the low levels. In addition, only the bus line selection signal $Z_1$ is set to the high level in response to the address signal, and the other bus line selection signal $Z_0$ is set to the low level. As a result, the FET $Q_{x+1}$ is turned ON, and the second signature information is read out from the ROM cells $SS_{m+1}$ through $SS_{2m+1}$ by successively selecting the bit lines $b_{m+1}$ through $b_{2m+1}$ by the bit line selection signals $Y_{m+1}$ through $Y_{2m+1}$.

Figure 5:
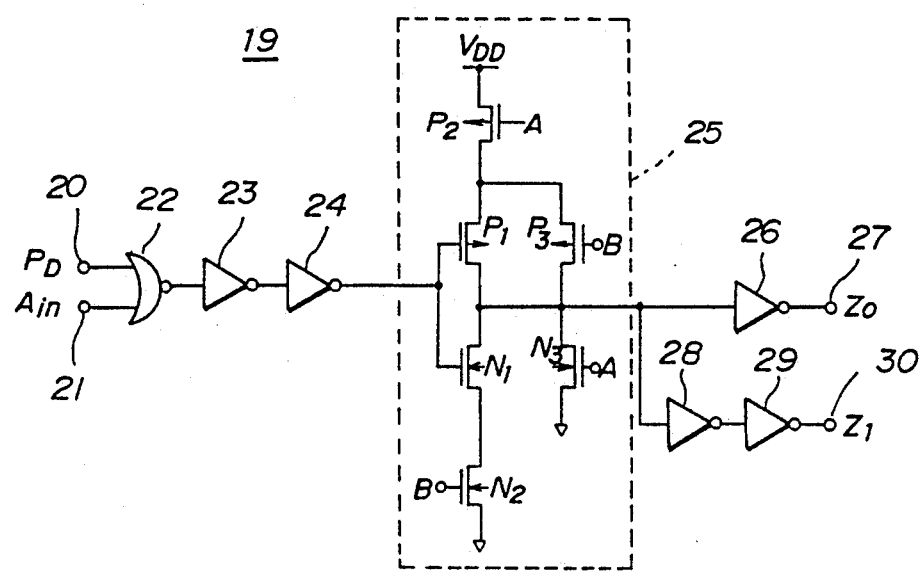
FIG. 5 is a circuit diagram showing an address buffer circuit of the PROM shown in FIG. 3.

The bus line selection signals $Z_0$ and $Z_1$ are generated by an address buffer circuit 19 shown in FIG. 5. A signal PD which has a high level in a standby mode is applied to a terminal 20, and an address signal $A_{in}$ for setting one of the bus line selection signals $Z_0$ and $Z_1$ to a high level is applied to a terminal 21 during a memory access mode. The signals PD and $A_{in}$ are supplied to a NOR circuit 22, and an output signal of the NOR circuit 22 is supplied to a buffer 25 via inverters 23 and 24.

The buffer 25 includes p-channel FETs P1 through P3 and n-channel FETs N1 through N3. The buffer 25 receives a low-level signal A and a high-level signal B in the memory access mode. Hence, the output signal of the inverter 24 is inverted by an inverter which is made up of the FETs P1 and N1 and is thereafter supplied to a terminal 27 via an inverter 26. On the other hand, the output signal of the inverter of the buffer 25 is supplied to a terminal 30 via inverters 28 and 29. The bus line selection signal $Z_0$ is output from the terminal 27, and the bus line selection signal $Z_1$ is output from the terminal 30.

When reading the first signature information, the signals A and B are both set to the high level to turn OFF the FETs P2 and P3 and turn ON the FETs N2 and N3. Thus, the bus line selection signal $Z_0$ has a high level and the bus line selection signal $Z_1$ has a low level in this case.

When reading the second signature information, the signals A and B are both set to the low level to turn ON the FETs P2 and P3 and turn OFF the FETs N2 and N3. Thus, the bus line selection signal $Z_0$ has a low level and the bus line selection signal $Z_1$ has a high level in this case.

Therefore, in this embodiment, types of signature information are stored in the ROM cells which are connected to the single word line $W_{n+1}$, and the desired signature information is read out by selecting this word line $W_{n+1}$ and selecting one bit line block by the bus line selection signals $Z_0$ and $Z_1$. Hence, only one word line is required exclusively for the signature circuit, and the area occupied by the signature circuit can be reduced effectively.

Of course, the number of types of signature information which can be stored is not limited to two, and more than two types of signature information can be stored using the single word line $W_{n+1}$. On the other hand, it is also possible to provide more than one word line for the signature circuit. In other words, the important thing is to store a plurality types of signature information using one word line.

Next, a description will be given of a second embodiment of the signature circuit according to the present invention.

Figure 6:
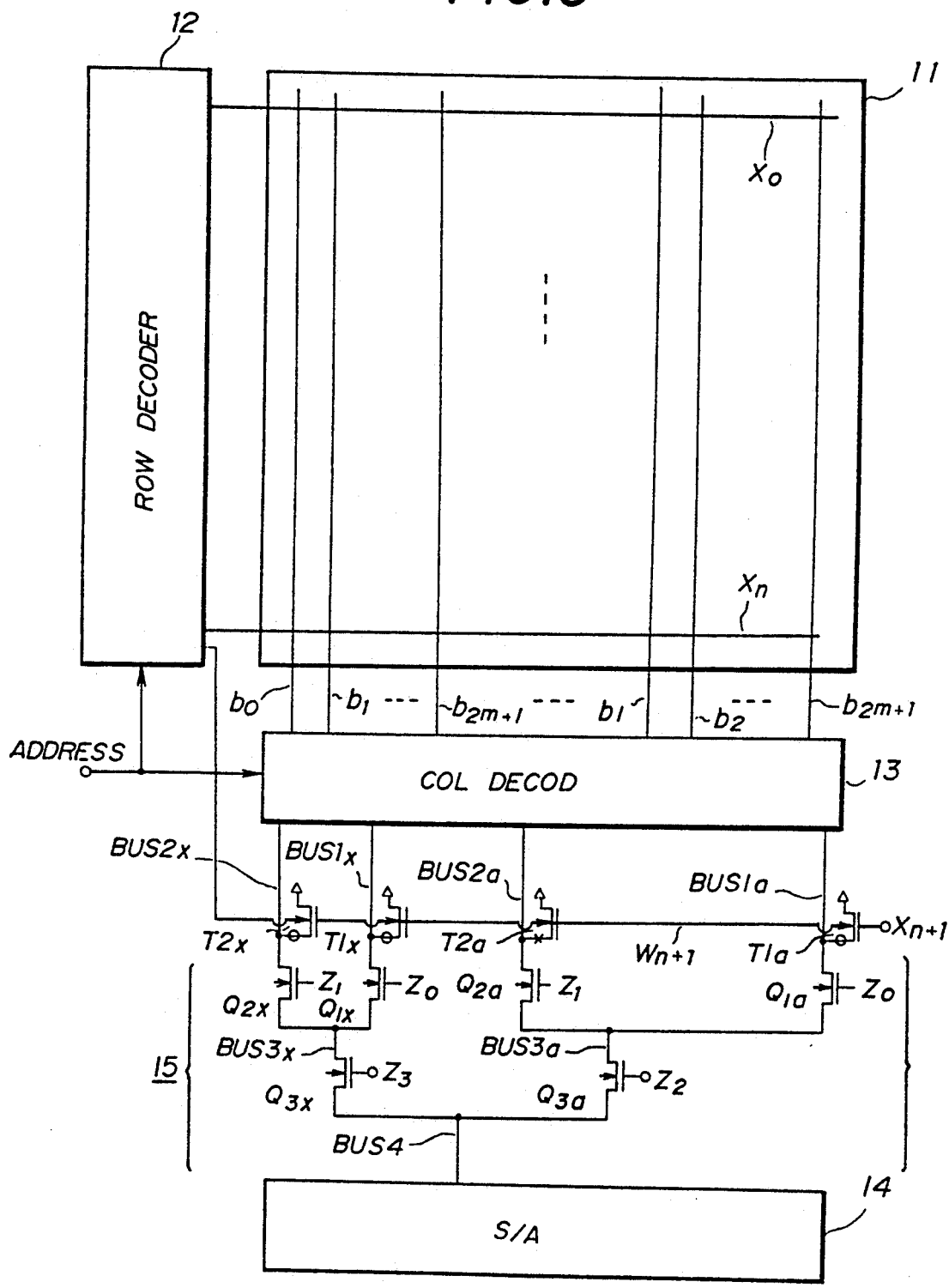
FIG. 6 is a system block diagram showing a general construction of a PROM to which a second embodiment of the signature circuit according to the present invention is applied.

FIG. 6 generally shows a PROM to which the second embodiment of the signature circuit according to the present invention may be applied. In FIG. 6, those parts which are the same as those corresponding parts in FIG. 3 are designated by the same reference numerals, and a description thereof will be omitted.

Figure 7:
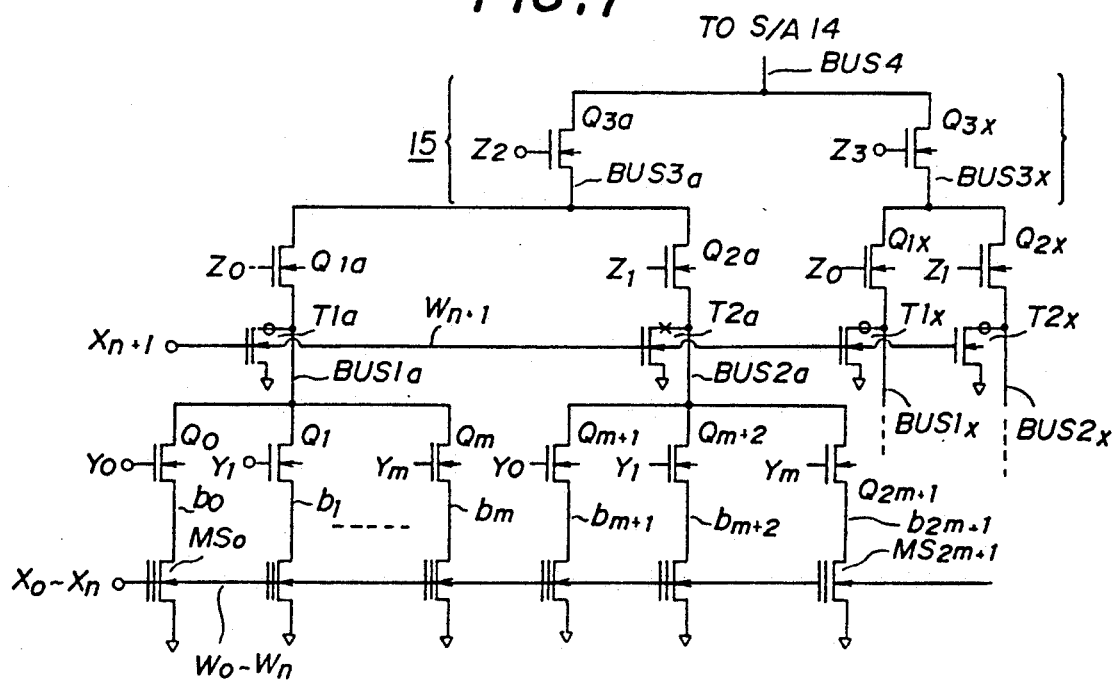
FIG. 7 is a circuit diagram showing the second embodiment of the signature circuit according to the present invention.

FIG. 7 shows an essential part of the second embodiment together with related parts of the PROM shown in FIG. 6. In this embodiment, the bit lines $b_0$ through $b_{2m+1}$ are divided into a pair of sub-blocks, and a plurality of such pairs of sub-blocks are provided. Plural pairs of bus lines BUS1a and BUS2a, . . . , and BUS1x and BUS2x are respectively connected to plural bus lines BUS3a, . . . , and BUS3x via the respective, plural pairs of FETs $Q_{1a}$ and $Q_{2a}$, . . . , and $Q_{1x}$ and $Q_{2x}$ which respectively receive the bus line selection signals $Z_0$ and $Z_1$. In addition, the plural pairs of FETs T1a and T2a, . . . , and T1x and T2x are respectively connected to the plural pairs of bus lines BUS1a and BUS2a, . . . , and BUS1x and BUS2x as the ROM cells for storing the signature information. The bus lines BUS3a through BUS3x are connected to the sense amplifier 14 via respective FETs $Q_{3a}$ through $Q_{3x}$ and a bus line BUS4. The FETs $Q_{3a}$ through $Q_{3x}$ respectively receive bus line selection signals $Z_2$ and $Z_3$.

The respective gates of the plural pairs of FETs T1a and T2a, . . . , and T1x and T2x, for storing the signature information, are respectively commonly connected to the word line $x_{n+1}$. The signature information is stored by forming a short-circuit or an open circuit between the drains of the FETs T1a and T2a, . . . , and T1x and T2x and the corresponding one of the bus lines BUS1a and BUS2a, . . . , and BUS1x and BUS2x. The short-circuit is indicated by a mark "o" while the open circuit is indicated by a mark "x". In this embodiment, the first type signature information is stored in the FETs T1a through T1x which correspond to the bus line selection signal $Z_0$, and the second type signature information is stored in the FETs T2a through T2x which correspond to the bus line selection signal $Z_1$.

When reading the first type signature information, only the word line $X_{n+1}$ is set to the high level in response to the address signal, and only the bus line selection signal $Z_0$ is set to the high level to select a first block. The first block is made up of one of the sub-blocks from each of the pairs of sub-blocks. Hence, the FETs $Q_{1a}$ . . . $Q_{1x}$ are turned ON, and the first signature information is read by successively selecting the bus lines BUS3a through BUS3x by the bus line selection signals $Z_2$ and $Z_3$ and successively selecting the bit lines. Similarly, when reading the second type signature information, only the word line $X_{n+1}$ is set to the high level in response to the address signal, and only the bus line selection signal $Z_1$ is set to the high level to select a second block. The second block is made up of the other of the sub-blocks from each of the pairs of sub-blocks. Hence, the FETs $Q_{2a}$ . . . $Q_{2x}$ are turned ON, and the second signature information is read by successively selecting the bus lines BUS3a through BUS3x by the bus line selection signals $Z_2$ and $Z_3$ and successively selecting the bit lines.

Therefore, in this embodiment, a plurality signature information are stored in the ROM cells which are connected to the single word line $W_{n+1}$, and the desired signature information is read out by selecting this word line $W_{n+1}$ and selecting the bit line blocks by the bus line selection signals $Z_0$ and $Z_1$. Hence, only one word line is required exclusively for the signature circuit, and the area occupied by the signature circuit can be reduced effectively.

It is also possible to provide more than one word line for the signature circuit. In other words, the important thing is to store a plurality of signature information using one word line, similarly as in the case of the first embodiment.

In addition, the word line $X_{n+1}$ and the ROM cells (T1a, T1x, etc.) are provided between the column decoder 13 and the sense amplifier 14 in FIG. 6 and does not form a part of the memory cell array 11. However, the word line $X_{n+1}$ and the ROM cells may of course form a part of the memory cell array 11 as in the case of the first embodiment by providing necessary interconnections between the ROM cells and the circuit part which is located between the column decoder 13 and the sense amplifier 14.

Further, the present invention is not limited to these embodiments, but various variations and modifications may be made without departing from the scope of the present invention.

What is claimed is:

1. A signature circuit for restoring signature information indicative of selectable, different device functions of a non-volatile memory device, said non-volatile memory device including an array of plural rows and plural columns of first memory cells, a plurality of first word lines respectively associated with the plural rows of first memory cells and a plurality of bit lines respectively associated with the plural columns of first memory cells, said signature circuit comprising:
   a row of plural second memory cells, the plural second memory cells of each row being connected respectively to the plurality of bit lines and said plurality of bit lines being grouped into plural blocks, each block comprising a sub-plurality of respective said bit lines and the plural blocks comprising plural and respective sub-pluralities of different said bit lines, the second memory cells respectively connected to the sub-plurality of bit lines of each block thereof storing a corresponding type of signature information and, accordingly, the number of blocks and the corresponding number of sub-pluralities of bit lines and respectively associated second memory cells defining the number of signature information types storable in the signature circuit;
   a second word line, respectively corresponding to and exclusively associated with the row of said second memory cells, the second word line being connected to each of said second memory cells of the respectively corresponding row; and
   selecting means, coupled to the plurality of bit lines in accordance with the sub-pluralities of the respective blocks thereof, for selecting one of the plurality of blocks and, accordingly, the respective sub-plurality of bit lines and thereby the second memory cells respectively connected thereto.

2. The signature circuit as recited in claim 1, wherein the non-volatile memory device comprises a row decoder connected to the plurality of first word lines and operative for selecting one of the first word lines in response to and as designated by an address signal, a column decoder connected to the plurality of bit lines and operative for selecting one of the plurality of bit lines in response to the address signal, and a sense amplifier connected to the plurality of bit lines, and wherein:

said row decoder further is connected to, and is operative for selecting, the row of plural second memory cells in response to and as designated by the address signal;

said selecting means is coupled between the column decoder and the sense amplifier and is operative for selectively supplying to the sense amplifier, in response to a selection signal designating a selected block and supplied to the selecting means during a signature information read mode, the signature information stored in the second memory cells respectively connected to the sub-plurality of bit lines of the selected block;

said column decoder, in response to the address signals supplied thereto during the signal read mode, successively selects the bit lines of the sub-plurality thereof corresponding to the selected block for reading out the signature information stored in the second memory cells respectively connected thereto; and the sense amplifier receives and amplifies the information received thereby over each respectively corresponding bit line, as selectively read out from each memory cell of the first and second pluralities of memory cells when selected by the column decoder for the first memory cells and when selected by the column decoder and the selecting means for the second memory cells.

3. The signature circuit as claimed in claim 2, which further comprises a number of first bus lines equal to the number of said blocks and a second bus line, said selecting means including transistors which have outputs thereof coupled via said second bus line to said sense amplifier, each of said first bus lines coupling the sub-plurality of bit lines of a corresponding one of said blocks to a corresponding one of said transistors and said selection signal turning ON the transistor corresponding to the selected block and turning OFF the remaining transistors.

4. The signature circuit as recited in claim 1, wherein said second word line, said second memory cells, the plurality of first word lines, the plurality of bit lines and the array of first memory cells comprise respective components of a common memory cell array.

5. The signature circuit as claimed in claim 1, wherein the selecting means further comprises an address buffer circuit which receives the address signal and a mode signal representing a standby mode of the non-volatile memory device and correspondingly a signature information read mode of the signature circuit and is responsive thereto for generating the selection signal during the signature information read mode, as designated by the mode signal.

6. The signature circuit as claimed in claim 1, wherein the plurality bit lines is grouped in accordance with plural groups, each group comprising a plurality of sub-block groups, and each block of a sub-plurality of bit lines comprises a composite of the corresponding sub-blocks of corresponding bit lines of the respective groups.

7. The signature circuit as recited in claim 6, wherein the non-volatile memory device comprises a row decoder connected to the plurality of first word lines and operative for selecting one of the first word lines in response to and as designated by an address signal, a column decoder connected to the plurality of bit lines and operative for selecting one of the plurality of bit lines in response to the address signal, and a sense amplifier connected to the plurality of bit lines, and wherein:

said row decoder further is connected to, and is operative for selecting, the row of plural second memory cells in response to and as designated by the address signal;

said selecting means is coupled between the column decoder and the sense amplifier and is operative for selectively supplying to the sense amplifier, in response to a selection signal designating a selected block and supplied to the selecting means during a signature information read mode, the signature information stored in the second memory cells respectively connected to the sub-plurality of bit lines of the selected block;

said column decoder, in response to the address signals supplied thereto during the signal read mode, successively selects the bit lines of the sub-plurality thereof corresponding to the selected block for reading out the signature information stored in the second memory cells respectively connected thereto; and the sense amplifier receives and amplifies the information received thereby over each respectively corresponding bit line, as selectively read out from each memory cell of the first and second pluralities of memory cells when selected by the column decoder for the first memory cells and when selected by the column decoder and the selecting means for the second memory cells.

8. The signature circuit as claimed in claim 7, further comprising:
 a number of first bus lines equal to the number of sub-blocks;
 a number of second bus lines equal to the number of said blocks;
 a third bus line; and
 said selecting means further comprises:
  first transistors having inputs respectively coupled through respective first bus lines to the respective bit lines of a corresponding sub-block, and
  second transistors having corresponding inputs respectively coupled through the second bus lines to outputs of the first transistors associated with a corresponding one of the sub-blocks and having outputs coupled in common through the third bus to the sense amplifier,
 the selection signal produced by the selecting means comprising a first component selection signal operative for turning ON the first transistor corresponding to the selected sub-block group and turning OFF the remaining first transistors of each sub-block group, and a second component selection signal operative for successively turning ON said second transistors.

9. The signature circuit as claimed in claim 6, wherein the plurality of first word lines, the plurality of first bit lines and the array of first memory cells comprise respective components of a common memory cell array, and wherein the second word lines and the plural second memory cells comprise an independent circuit connected to the memory cell array.

10. The signature circuit as claimed in claim 6, wherein the selecting means further comprises an address buffer circuit which receives the address signal and a mode signal representing a standby mode of the non-volatile memory device and correspondingly a signature information read mode of the signature circuit and is responsive thereto for generating the selection signal during the signature information read mode, as designated by the mode signal.

* * * * *

UNITED STATES PATENT AND TRADEMARK OFFICE
CERTIFICATE OF CORRECTION

PATENT NO. : 5,280,451
DATED : January 18, 1994
INVENTOR(S) : AKAOGI

It is certified that error appears in the above-indentified patent and that said Letters Patent is hereby corrected as shown below:

Title page, item [57] Inventor: change "Inagi" to --Tokyo--.

Col. 2,   line 58, change "block" to --blocks--.

Col. 4,   line 52, after "embodiment," insert --two--;

Col. 5,   line 31, delete "respectively".

Signed and Sealed this

Fourth Day of October, 1994

Attest:

BRUCE LEHMAN

Attesting Officer      Commissioner of Patents and Trademarks